(12) United States Patent
Lee et al.

(10) Patent No.: US 11,615,745 B2
(45) Date of Patent: Mar. 28, 2023

(54) PIXEL AND DISPLAY DEVICE HAVING THE SAME

(71) Applicant: SAMSUNG DISPLAY CO., LTD., Yongin-si (KR)

(72) Inventors: Seung Chan Lee, Yongin-si (KR); Beom Soo Park, Yongin-si (KR); Wang Jo Lee, Yongin-si (KR); Seong Jun Lee, Yongin-si (KR); Yoon Ah Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/700,863

(22) Filed: Mar. 22, 2022

(65) Prior Publication Data

US 2023/0033692 A1 Feb. 2, 2023

(30) Foreign Application Priority Data

Jul. 28, 2021 (KR) .......................... 10-2021-0099510

(51) Int. Cl.
*G09G 3/20* (2006.01)
*G09G 3/3233* (2016.01)
(Continued)

(52) U.S. Cl.
CPC ... *G09G 3/3233* (2013.01); *G09G 2300/0426* (2013.01); *G09G 2300/0819* (2013.01);
(Continued)

(58) Field of Classification Search
CPC ......... G09G 3/3233; G09G 2300/0426; G09G 2300/0819; G09G 2300/0842;
(Continued)

(56) References Cited

U.S. PATENT DOCUMENTS

| 7,515,406 B2 | 4/2009 | Kee et al. |
| 7,902,602 B2 | 3/2011 | Koo et al. |

(Continued)

FOREIGN PATENT DOCUMENTS

| KR | 100560796 B1 | 3/2006 |
| KR | 101400284 B1 | 5/2014 |

*Primary Examiner* — Michael J Eurice
(74) *Attorney, Agent, or Firm* — Cantor Colburn LLP

(57) ABSTRACT

A pixel includes: a driving transistor including a gate electrode coupled to a first node, a first electrode coupled to a second node, and a second electrode coupled to a third node; a first initialization transistor coupled between the first node and a first initialization voltage line, and including a gate electrode coupled to a scan line, where the first initialization voltage line is configured to supply a first initialization voltage; a first emission control transistor coupled between a fourth node and a fifth node and including a gate electrode coupled to the first node; a second emission control transistor coupled between the third node and the fifth node and including a gate electrode coupled to an emission control line; and a light-emitting element coupled between the fourth node and a driving low voltage line. The driving transistor and the first emission control transistor are different types of transistors.

20 Claims, 13 Drawing Sheets

(51) Int. Cl.
*H01L 27/32* (2006.01)
*H01L 29/786* (2006.01)

(52) U.S. Cl.
CPC .............. *G09G 2300/0842* (2013.01); *G09G 2310/0202* (2013.01); *G09G 2320/0233* (2013.01); *G09G 2330/025* (2013.01); *G09G 2330/08* (2013.01); *H01L 27/3262* (2013.01); *H01L 27/3265* (2013.01); *H01L 29/7869* (2013.01); *H01L 29/78672* (2013.01)

(58) Field of Classification Search
CPC ....... G09G 2310/0202; G09G 2310/08; G09G 2320/0233; G09G 2330/025; G09G 2330/08; H01L 127/3262; H01L 27/3265; H01L 29/78672; H01L 29/7869
See application file for complete search history.

(56) References Cited

U.S. PATENT DOCUMENTS

| | | | | |
|---|---|---|---|---|
| 2016/0322442 | A1* | 11/2016 | Lee | H01L 27/1255 |
| 2017/0053975 | A1* | 2/2017 | Cho | H01L 27/1288 |
| 2017/0317158 | A1* | 11/2017 | Choi | H01L 27/3276 |
| 2019/0386079 | A1* | 12/2019 | Kang | G09G 3/3225 |
| 2021/0407409 | A1* | 12/2021 | Zheng | G09G 3/3266 |
| 2022/0310011 | A1* | 9/2022 | Chen | G09G 3/3233 |
| 2022/0343835 | A1* | 10/2022 | Cong | H05B 44/00 |

\* cited by examiner

T3: T3-1, T3-2
T4: T4-1, T4-2

PIXEL AND DISPLAY DEVICE HAVING THE SAME

The present application claims priority to Korean patent application number 10-2021-0099510 filed on Jul. 28, 2021, and all the benefits accruing therefrom under 35 U.S.C. § 119, the content of which in its entirety is herein incorporated by reference.

BACKGROUND

1. Technical Field

Various embodiments of the present disclosure relate to a pixel and a display device having the pixel.

2. Related Art

With an increase in interest in an information display and an increase in demand to use portable information media, demand for display devices is markedly increased, and commercialization thereof is progressing.

SUMMARY

Various embodiments of the present disclosure are directed to a pixel that is capable of minimizing a bright spot defect and a display device having the pixel.

An embodiment of the present disclosure provides for a pixel. The pixel includes: a driving transistor including a gate electrode coupled to a first node, a first electrode coupled to a second node, and a second electrode coupled to a third node; a first initialization transistor coupled between the first node and a first initialization voltage line, and including a gate electrode coupled to a scan line, where the first initialization voltage line is configured to supply a first initialization voltage; a first emission control transistor coupled between a fourth node and a fifth node and including a gate electrode coupled to the first node; a second emission control transistor coupled between the third node and the fifth node and including a gate electrode coupled to an emission control line; and a light-emitting element coupled between the fourth node and a driving low voltage line. The driving transistor and the first emission control transistor are different types of transistors from each other.

A first electrode of the first emission control transistor and a first electrode of the second emission control transistor may be coupled to the fifth node.

The pixel may further include: a switching transistor coupled between a data line and the second node, and including a gate electrode coupled to a first scan line, where the data line is configured to supply a data voltage; and a compensation transistor coupled between the first node and the third node, and including a gate electrode coupled to a second scan line. The scan line coupled to the gate electrode of the first initialization transistor is a third scan line.

Each of the compensation transistor and the first initialization transistor may include an oxide semiconductor layer.

The pixel may further include: a third emission control transistor coupled between a driving high voltage line and the second node and including a gate electrode coupled to the emission control line; and a second initialization transistor coupled between a second initialization voltage line and the fourth node, and including a gate electrode coupled to a fourth scan line, where the second initialization voltage line is configured to supply a second initialization voltage.

Each of the driving transistor, the switching transistor, the first emission control transistor, the second emission control transistor, the third emission control transistor, and the second initialization transistor may include a polycrystalline silicon semiconductor layer.

When a fourth scan signal is supplied to the fourth scan line, the second initialization transistor is turned on, the second initialization voltage may be applied to the fourth node, and a voltage of a first electrode of the light-emitting element is initialized.

When a third scan signal is supplied to the third scan line, the first initialization transistor may be turned on, the first initialization voltage may be applied to the first node, and a voltage of the gate electrode of the driving transistor may be initialized.

When a first scan signal is supplied to the first scan line, the switching transistor may be turned on, whereas when a second scan signal is supplied to the second scan line, the compensation transistor may be turned on, and a voltage corresponding to a difference between the data voltage and a threshold voltage of the driving transistor may be applied to the first node.

A threshold voltage of the first emission control transistor may be less than the voltage of the first node and is greater than the first initialization voltage.

When the second emission control transistor and the third emission control transistor are turned on, a driving current that is provided through the driving transistor may not be supplied to the light-emitting element.

An embodiment of the present disclosure provides a pixel. The pixel includes: a first transistor including a gate electrode coupled to a first node, a first electrode coupled to a second node, and a second electrode coupled to a third node; a second transistor coupled between a data line and the second node, and including a gate electrode coupled to a first scan line, where the data line is configured to supply a data voltage; a third transistor coupled between the first node and the third node and including a gate electrode coupled to a second scan line, a fourth transistor coupled between the first node and a first initialization voltage line, and including a gate electrode coupled to a third scan line, where the first initialization voltage line is configured to supply a first initialization voltage; a fifth transistor coupled between a driving high voltage line and the second node and including a gate electrode coupled to an emission control line; a sixth transistor coupled between a fourth node and a fifth node and including a gate electrode coupled to the emission control line; a seventh transistor coupled between a second initialization voltage line and the fourth node, and including a gate electrode coupled to a fourth scan line, where the second initialization voltage line is configured to supply a second initialization voltage; an eighth transistor coupled between the third node and the fifth node and including a gate electrode coupled to the first node; and a light-emitting element coupled between the fourth node and a driving low voltage line, wherein the fifth node couples a first electrode of the sixth transistor to a first electrode of the eighth transistor, and wherein the first transistor and the eighth transistor are different types of transistors from each other.

Each of the third transistor and the fourth transistor may include an oxide semiconductor layer.

Each of the first transistor, the second transistor, the fifth transistor, the sixth transistor, the seventh transistor, and the eighth transistor may include a polycrystalline silicon semiconductor layer.

When a fourth scan signal is supplied to the fourth scan line, the seventh transistor may be turned on, the second initialization voltage may be applied to the fourth node, and a voltage of a first electrode of the light-emitting element may be initialized.

When a third scan signal is supplied to the third scan line, the fourth transistor may be turned on, the first initialization voltage may be applied to the first node, and a voltage of the gate electrode of the first transistor may be initialized.

When a first scan signal is supplied to the first scan line, the second transistor may be turned on, whereas when a second scan signal is supplied to the second scan line, the third transistor may be turned on, and a voltage corresponding to a difference between the data voltage and a threshold voltage of the first transistor may be applied to the first node, and the voltage of the first node may be greater than a threshold voltage of the eighth transistor.

An embodiment of the present disclosure provides a display device. The display device includes: a substrate; a semiconductor layer disposed on the substrate, and including a driving semiconductor pattern and an emission control semiconductor pattern; and a first gate conductive layer which at least partially overlaps the semiconductor layer in a plan view, and including a gate electrode. A first portion of the gate electrode overlapping the driving semiconductor pattern constitutes a gate electrode of a driving transistor, and an extension portion of the gate electrode overlapping the emission control semiconductor pattern constitutes a gate electrode of an emission control transistor.

The display device may further include: a second gate conductive layer including a storage first electrode overlapping the gate electrode in the plan view, where the gate electrode of the driving transistor may overlap the storage first electrode to form a storage capacitor.

The semiconductor layer may include a polycrystalline silicon semiconductor.

DETAILED DESCRIPTION

Figure 1:
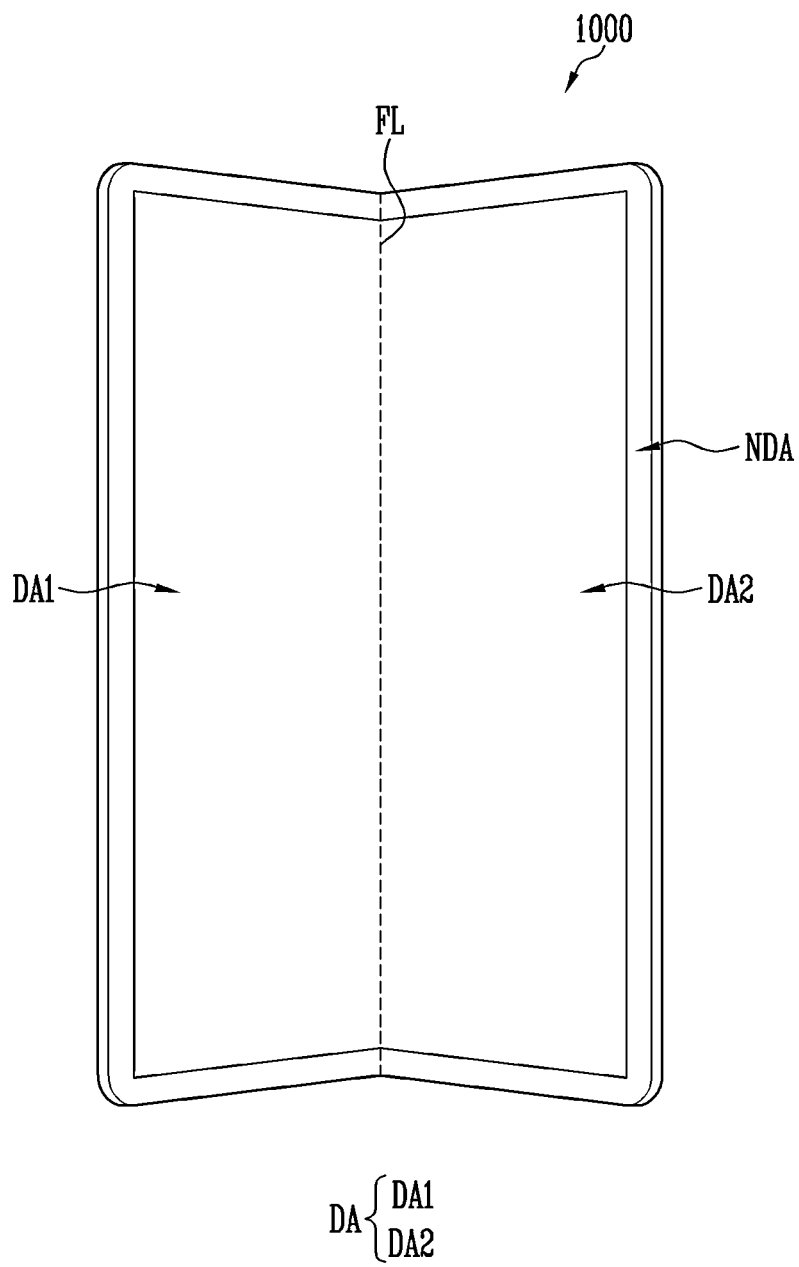
FIG. 1 is a perspective view schematically illustrating a display device according to an embodiment.

As the present disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element. In the present disclosure, the singular forms are intended to include the plural forms as well, unless the context clearly indicates otherwise.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, a region, or a plate is disposed on a second part, the first part may be not only directly on the second part but a third part may intervene between them. Furthermore, when it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, when a first part such as a layer, a film, a region, or a plate is under a second part, the first part may be not only directly under the second part but a third part may intervene between them.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Hereinafter, a pixel and a display device having the pixel according to embodiments of the present disclosure will be described in detail with reference to the attached drawings related to the embodiments of the present disclosure.

FIG. 1 is a perspective view schematically illustrating a display device according to an embodiment.

Referring to FIG. 1, a display device 1000 according to an embodiment may be a foldable display device including a flexible substrate, a flexible window, etc.

Although the display device 1000 according to an embodiment is illustrated as being applied to a smartphone, the present disclosure is not limited thereto. The foldable display device may be applied to a mobile phone besides a smartphone, a tablet PC, a personal digital assistant ("PDA"), a portable multimedia player ("PMP"), a television ("TV"), a game console, a wristwatch-style electronic device, a head-mounted display, a PC monitor, a notebook computer, a vehicle navigation device, a vehicle dashboard, a digital camera, a camcorder, an outdoor billboard, a signboard, a medical device, an inspective device, various household appliances such as a refrigerator and a washing machine, or Internet of things ("IoT") devices.

The display device 1000 may include a display area DA in which an image is displayed and a non-display area NDA in which an image is not displayed. The display area DA may include a first display area DA1 and a second display area DA2 which may face each other along a folding line DL. The first display area DA1 and the second display area DA2 may be provided to have the same areas that can overlap each other. The present disclosure is not limited thereto. The first display area DA1 and the second display area DA2 may be provided to have different areas that can partially overlap each other in another embodiment. The non-display area NDA may be provided to enclose the display area DA.

Although the display device 1000 may be provided in the shape of a rectangular plate having angular corners, the display device 1000 may be implemented in the shape of a rectangular plate having rounded corners in accordance with an embodiment. Further, the present disclosure is not limited thereto, and the display device 1000 may be implemented in various shapes.

The display device 1000 may include a self-emissive display panel, such as an organic light-emitting display panel ("OLED" panel), a nano-scale light-emitting diode ("LED") display panel, and a quantum dot organic light-emitting display panel ("QD" OLED panel).

Hereinafter, the configuration of a display device will be described in detail with reference to FIG. 2.

Figure 2:
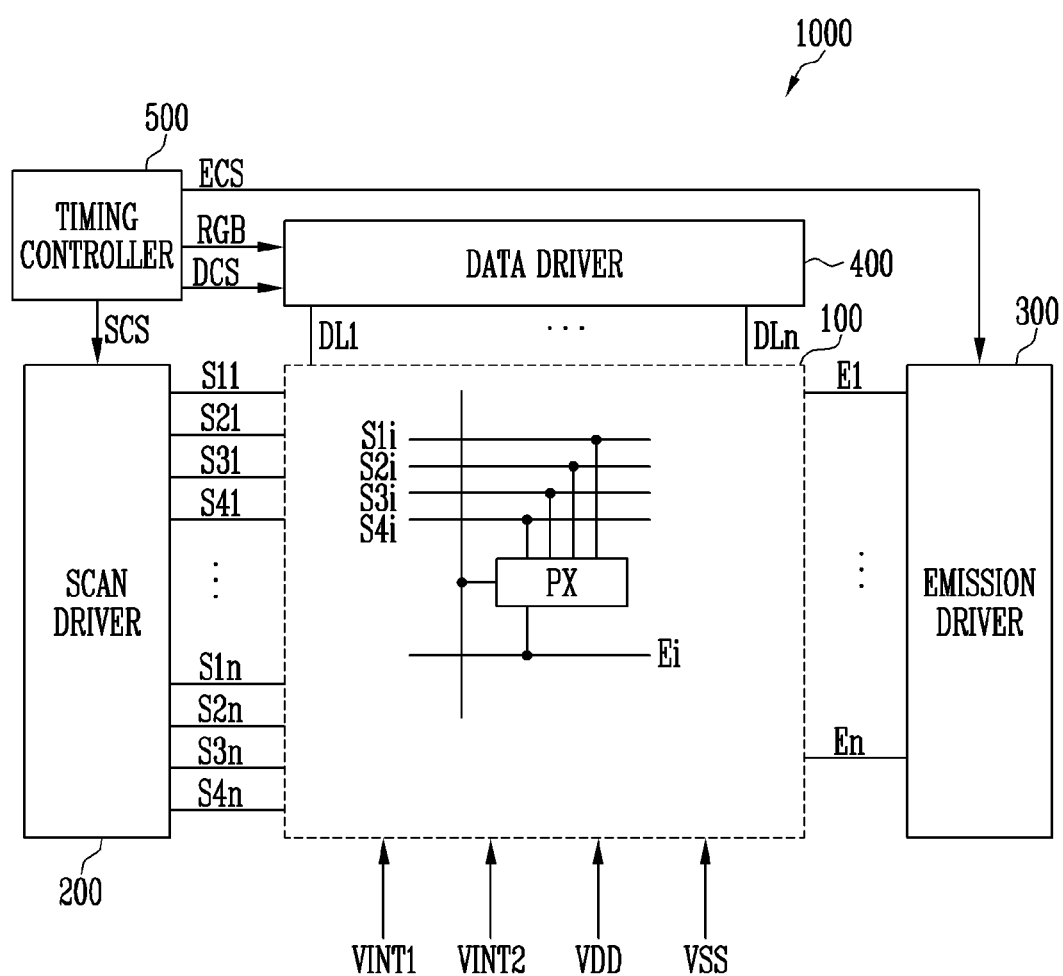
FIG. 2 is a block diagram illustrating a display device according to an embodiment.

FIG. 2 is a block diagram illustrating a display device according to an embodiment.

Referring to FIG. 2, a display device 1000 may include a display panel 100, a scan driver 200, an emission driver 300, a data driver 400, and a timing controller 500.

The display panel 100 may include scan lines S11 to S1$n$, S21 to S2$n$, S31 to S3$n$, and S41 to S4$n$, emission control lines E1 to En, and data lines D1 to Dn, and may include pixels PX coupled to the scan lines S11 to S1$n$, S21 to S2$n$, S31 to S3$n$, and S41 to S4$n$, the emission control lines E1 to En, and the data lines D1 to Dn (where m and n are integers greater than 1). Each of the pixels PX may include a driving transistor and a plurality of switching transistors. The pixels PX may be supplied with a first driving voltage VDD, a second driving voltage VSS, a first initialization voltage VINT1, a second initialization voltage VINT2, etc. from an external device.

In an embodiment of the present disclosure, signal lines coupled to each pixel PX may be variously set to correspond to the circuit structure of the pixel PX.

The scan driver 200 may supply a first scan signal, a second scan signal, a third scan signal, and a fourth scan signal to the first scan lines S11 to Sin, the second scan lines S21 to S2$n$, the third scan lines S31 to S3$n$, and the fourth scan lines S41 to S4$n$, respectively, in response to a first control signal SCS.

The first to fourth scan signals may be set to gate-on voltages (e.g., low voltages or high voltages) corresponding to the types of transistors to which the corresponding scan signals are supplied. For example, the gate-on voltage of a scan signal supplied to a PMOS transistor may have a logic low level, and the gate-on voltage of a scan signal supplied to an NMOS transistor may have a logic high level. Hereinafter, the expression "scan signal is supplied" may be understood to mean that the scan signal is supplied at a logic level that enables a transistor controlled thereby to be turned on.

The emission driver 300 may supply an emission control signal to the emission control lines E1 to En in response to a second control signal ECS. For example, the emission control signal may be sequentially supplied to the emission control lines E1 to En.

The emission control signal may be set to a gate-on voltage (e.g., a high voltage or a low voltage). A transistor that has received the emission control signal may be turned on in the case where the emission control signal is supplied, and may be set to a turn-off state in other cases. Hereinafter, the expression "emission control signal is supplied" may be understood to mean that the emission control signal is supplied at a logic level that enables a transistor controlled thereby to be turned on.

Although, in FIG. 2, each of the scan driver 200 and the emission driver 300 is illustrated as being a single component for convenience of description, the present disclosure is not limited thereto. According to the design, the scan driver 200 may include a plurality of scan drivers, each of which supplies at least one of the first to fourth scan signals. Also, at least some of the scan driver 200 and the emission driver 300 may be integrated into a driver circuit, a module, or the like.

The data driver 400 may receive a third control signal DCS and image data RGB from the timing controller 500. The data driver 400 may convert digital image data RGB into an analog data signal (data voltage). The data driver 400 may supply the data signal to the data lines D1 to Dn in response to the third control signal DCS. Here, the data signal supplied to the data lines D1 to Dn may be supplied in synchronization with the first scan signal supplied to the first scan lines S11 to Sin.

The timing controller 500 may receive the input image data and the control signals from a host system, such as an application processor ("AP"), through a predetermined interface.

The timing controller 500 may generate the first control signal SCS, the second control signal ECS, and the third control signal DCS based on the input image data, a synchronization signal (e.g., a vertical synchronization signal, a horizontal synchronization signal, etc.), a data enable signal, a clock signal, etc.

The first control signal SCS may be supplied to the scan driver 200, the second control signal ECS may be supplied to the emission driver 300, and the third control signal DCS may be supplied to the data driver 400. The timing controller 500 may supply the image data RGB, obtained by rearranging the input image data, to the data driver 400.

Hereinafter, the pixel included in the display device of FIG. 2 will be described in detail with reference to FIG. 3.

Figure 3:
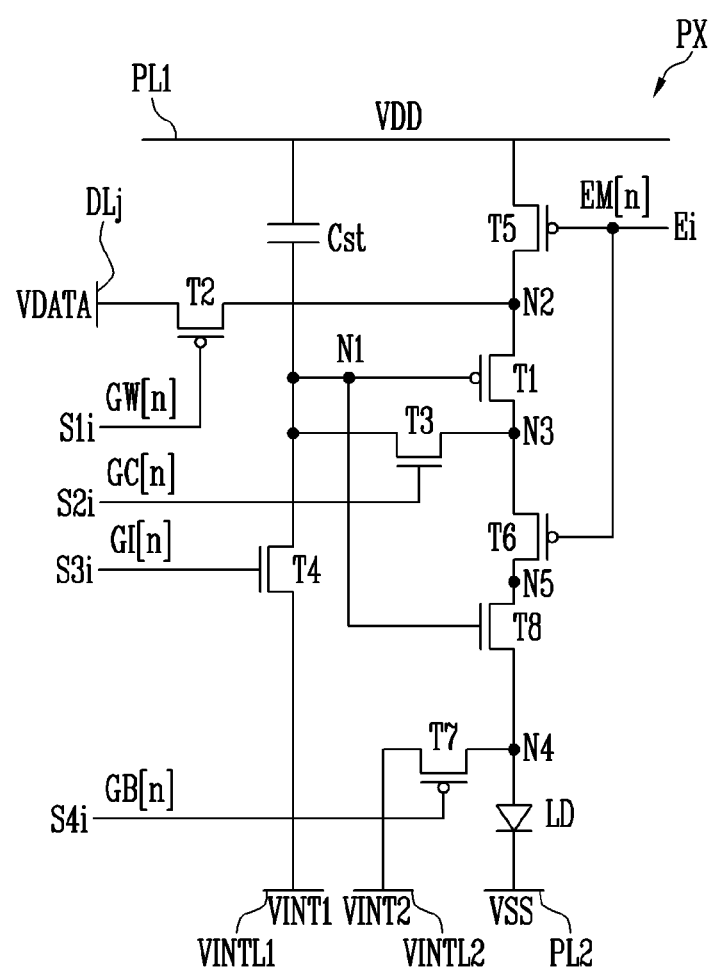
FIG. 3 is a circuit diagram illustrating an example of a pixel according to an embodiment.

FIG. 3 is a circuit diagram illustrating an example of a pixel according to an embodiment.

In FIG. 3, for convenience of description, a pixel PX that is disposed on an i-th horizontal line (or an i-th pixel row) and is coupled to a j-th data line Dj is illustrated (where i and j are natural numbers).

Referring to FIG. 3, the pixel PX may include a light-emitting element LD, first to eighth transistors T1 to T8, and a storage capacitor Cst.

The light-emitting element LD may have a first electrode coupled to a fourth node N4 and a second electrode coupled to a second power line PL2 (or a driving low-voltage line) for transferring a second driving voltage VSS. The light-emitting element LD may generate (or emit) light with predetermined luminance in accordance with the amount of current (or driving current) supplied from the first transistor T1.

In an embodiment, the light-emitting element LD may be an organic light-emitting diode including an organic light-emitting layer. In an embodiment, the light-emitting element LD may be an inorganic light-emitting element formed of an inorganic material. In another embodiment, the light-emitting element LD may be a light-emitting element in which an inorganic material and an organic material are combined with each other. Alternatively, the light-emitting element LD may have a form in which a plurality of inorganic light-emitting elements are coupled in parallel and/or in series between the second power line PL2 and the fourth node N4.

The first transistor T1 (or a driving transistor) may have a gate electrode coupled to a first node N1, a first electrode coupled to a second node N2, and a second electrode coupled to a third node N3.

The first transistor T1 may control the amount of current flowing from a source of a first driving voltage VDD into a source of the second driving voltage VSS via the light-emitting element LD in accordance with the voltage of the first node N1. For this operation, the first driving voltage VDD may be set to a voltage higher than the second driving to voltage VSS.

The second transistor T2 (or a switching transistor) may be coupled between a j-th data line Dj (hereinafter referred to as a "data line") and the second node N2. The second transistor T2 may have a gate electrode coupled to an i-th first scan line S1i (hereinafter referred to as a "first scan line"). The second transistor T2 may be turned on to electrically connect the data line Dj to the second node N2 when a first scan signal GW[n] is supplied to the first scan line S1i.

The third transistor T3 (or a compensation transistor) may be coupled between the second electrode (i.e., the third node N3) and the gate electrode (i.e., the first node N1) of the first transistor T1. The third transistor T3 may have a gate electrode coupled to an i-th second scan line S2i (hereinafter referred to as a "second scan line"). The third transistor T3 may be turned on to electrically connect the second electrode and the gate electrode (or the third node N3 and the first node N1) of the first transistor T1 to each other when a second scan signal GC[n] is supplied to the second scan line S2i. That is, the timing at which the second electrode (e.g., the drain electrode) of the first transistor T1 is coupled to the gate electrode of the first transistor T1 may be controlled in response to the second scan signal GC[n]. When the third transistor T3 is turned on, the first transistor T1 may function in the form of a diode.

The fourth transistor T4 (or a first initialization transistor) may be coupled between the first node N1 (or the gate electrode of the first transistor T1) and a first initialization voltage line VINTL1. A gate electrode of the fourth transistor T4 may be coupled to an i-th third scan line S3i (hereinafter referred to as a "third scan line"). The fourth transistor T4 may be turned on in response to a third scan signal GI[n] supplied to the third scan line S3i, thus supply a first initialization voltage VINT1 to the first node N1. Here, the first initialization voltage VINT1 may be set to a voltage lower than a data voltage VDATA supplied to the data line Dj. Accordingly, the gate voltage (or the voltage of the first node N1) of the first transistor T1 may be initialized to the first initialization voltage VINT1 as the fourth transistor T4 is turned on.

The fifth transistor T5 (or a third emission control transistor) may be coupled between a first power line PL1 (or a driving high-voltage line) and the second node N2. A gate electrode of the fifth transistor T5 may be coupled to an i-th emission control line Ei (hereinafter referred to as an "emission control line"). The fifth transistor T5 is turned on in the case where an emission control signal EM[n] is supplied to the emission control line Ei, and is turned off in the other cases.

The sixth transistor T6 (or a second emission control transistor) may be coupled between the second electrode (i.e., the third node N3) of the first transistor T1 and a first electrode of the eighth transistor T8 (or a fifth node N5). A gate electrode of the sixth transistor T6 may be coupled to the emission control line Ei. The sixth transistor T6 may be controlled in substantially the same manner as the fifth transistor T5.

The fifth transistor T5 and the sixth transistor T6 may be turned on in response to the emission control signal EM[n] provided through the emission control line Ei, and may form a movement path for a driving current between the first power line PL1 and the fourth node N4 (or between the first power line PL1 and the second power line PL2).

Although, in FIG. 3, the fifth transistor T5 and the sixth transistor T6 are illustrated as being coupled to the same emission control line Ei, this is only an example. In another embodiment, the fifth transistor T5 and the sixth transistor T6 may be coupled to separate emission control lines, respectively, through which different emission control signals are supplied.

The seventh transistor T7 (or a second initialization transistor) may be coupled between the fourth node N4 and a second initialization voltage line VINTL2. A gate electrode of the seventh transistor T7 may be coupled to an i-th fourth scan line S4i (hereinafter referred to as a "fourth scan line"). The seventh transistor T7 may be turned on to supply a second initialization voltage VINT2 to the fourth node N4 when a fourth scan signal GB[n] is supplied to the fourth scan line S4i. That is, the seventh transistor T7 may initialize the fourth node N4 in response to the fourth scan signal GB[n].

The eighth transistor T8 (or a first emission control transistor) may be coupled between the second electrode (or the fifth node N5) of the sixth transistor T6 and the fourth node N4 (i.e., the first electrode of the light-emitting element LD). A gate electrode of the eighth transistor T8 may be coupled to the first node N1 (i.e., the gate electrode of the first transistor T1). The eighth transistor T8 may control a driving current (or the amount of current) that is supplied to the light-emitting element LD through the first transistor T1 and the sixth transistor T6 in accordance with the voltage of the first node N1.

The type of (i.e., doping type) the eighth transistor T8 may be different from the type of the first transistor T1. For example, when the first transistor T1 is a P-type transistor, the eighth transistor T8 may be an N-type transistor. The threshold voltage of the eighth transistor T8 may be greater than the voltage of the first node N1 (e.g., a voltage corresponding to a difference between the data voltage VDATA and the threshold voltage of the first transistor T1), and the threshold voltage of the first transistor T1 may be less than the voltage of the first node N1. The threshold voltage of the eighth transistor T8 may vary depending on the degree of doping of the eighth transistor T8 doped with a semiconductor pattern and/or the channel size of the eighth transistor T8.

In an embodiment, the pixel PX is configured such that the eighth transistor T8 is coupled between the first transistor T1 and the light-emitting element LD. Accordingly, even if the second transistor T2 and/or the third transistor T3 are not normally driven due to defects in the second transistor T2 and/or the third transistor T3, a phenomenon, in which the first transistor T1 supplies an excessive driving current to the light-emitting element LD after application of an initialization voltage to the gate electrode of the first transistor T1, may be effectively prevented. Such a phenomenon may be referred to as a "bright spot defect". That is, a bright spot defect that occurs when the first transistor T1 supplies an excessive driving current to the light-emitting element LD may be effectively minimized due the eighth transistor T8.

The storage capacitor Cst may be coupled between the first power line PL1 and the first node N1. The storage capacitor Cst may store a voltage corresponding to a difference between the first driving voltage VDD supplied from the first power line PL1 and a voltage, obtained by subtracting the absolute threshold voltage of the first transistor T1 from the data voltage VDATA applied to the first node N1.

In an embodiment, each of the first, second, fifth, sixth, seventh, and eighth transistors T1, T2, T5, T6, T7, and T8 may include a semiconductor layer formed of polycrystalline silicon (polysilicon). A polycrystalline silicon transistor may be a low-temperature polysilicon ("LTPS") transistor. The polycrystalline silicon transistor has high electron mobility, and then has driving characteristics faster than those of other transistors.

The first, second, fifth, sixth, and seventh transistors T1, T2, T5, T6, and T7 may be P-type transistors, and the eighth transistor T8 may be an N-type transistor. That is, in an embodiment, the first transistor T1 and the eighth transistor T8 may be implemented in different types from each other. The present disclosure is not limited thereto, and thus the first, second, fifth, sixth, and seventh transistors T1, T2, T5, T6, and T7 may be N-type transistors, and the eighth transistor T8 may be a P-type transistor in another embodiment.

Each of the third and fourth transistors T3 and T4 may include a semiconductor layer made of an oxide semiconductor. An oxide semiconductor transistor may have charge mobility lower than charge mobility of a polycrystalline silicon transistor. Therefore, the amount of leakage current occurring in a turn-off state of oxide semiconductor transistors may be less than the amount of leakage current in polycrystalline silicon transistors.

The third and fourth transistors T3 and T4 may be N-type transistors. The present disclosure is not limited thereto, and the third and fourth transistors T3 and T4 may be P-type transistors in another embodiment.

Below, the operation of the pixel of FIG. 3 will be described in detail with reference to FIGS. 4 to 10.

Figure 4:
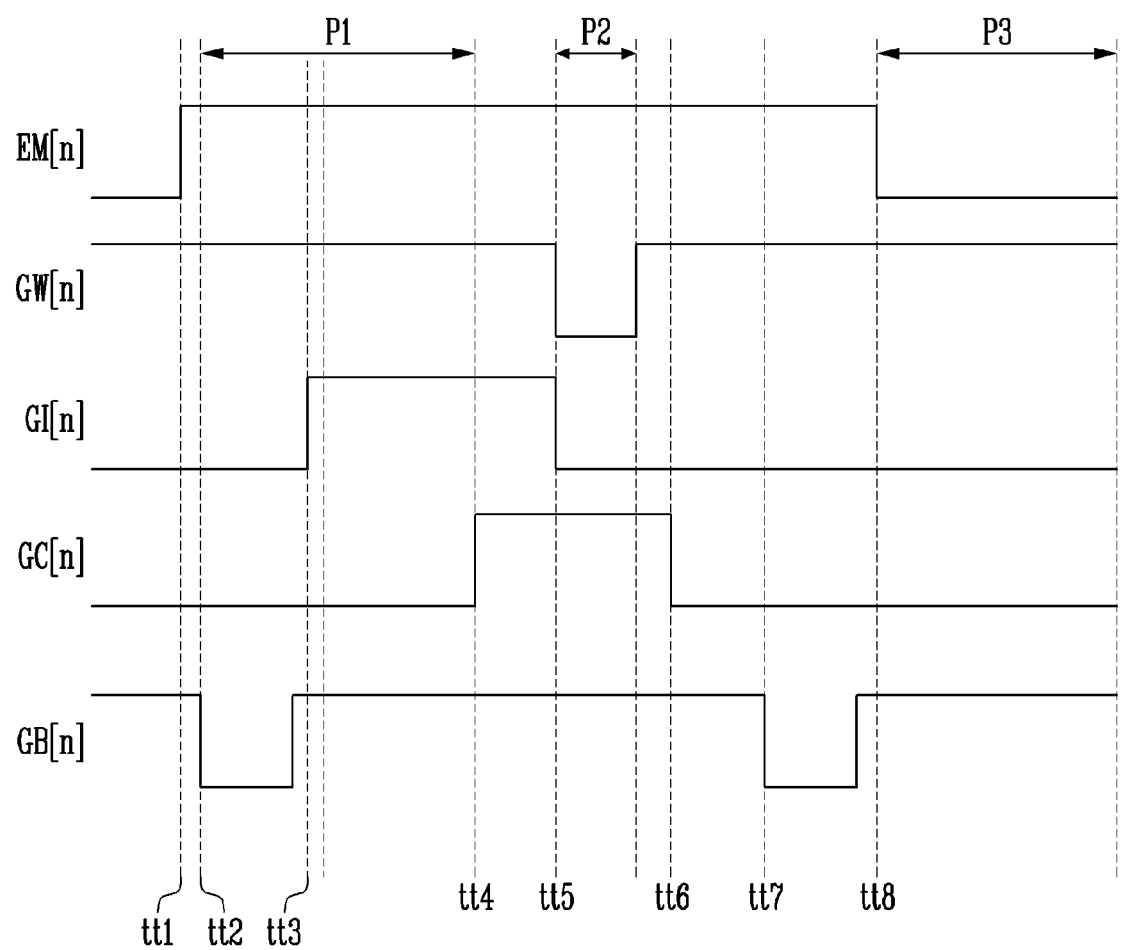
FIG. 4 is a waveform diagram for explaining an example of the operation of the pixel of FIG. 3.

FIG. 4 is a waveform diagram illustrating an example of the operation of the pixel of FIG. 3, and FIGS. 5 to 10 are circuit diagrams for explaining the operation of the pixel of FIG. 3.

Figure 5:
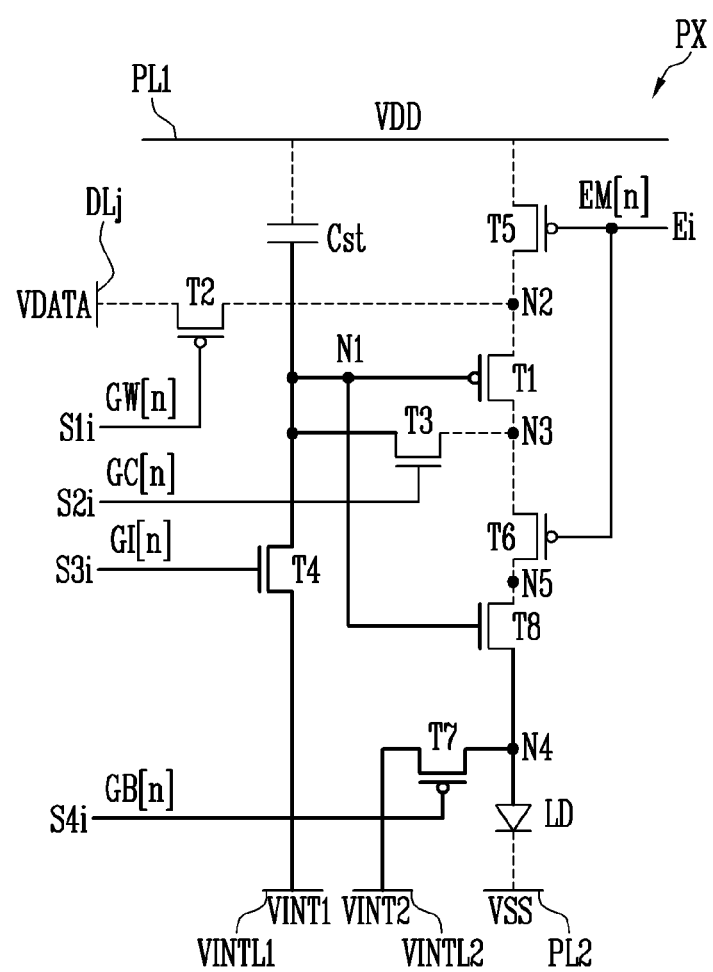
FIGS. 5 to 10 are circuit diagrams for explaining the operation of the pixel of FIG. 3.
Figure 6:
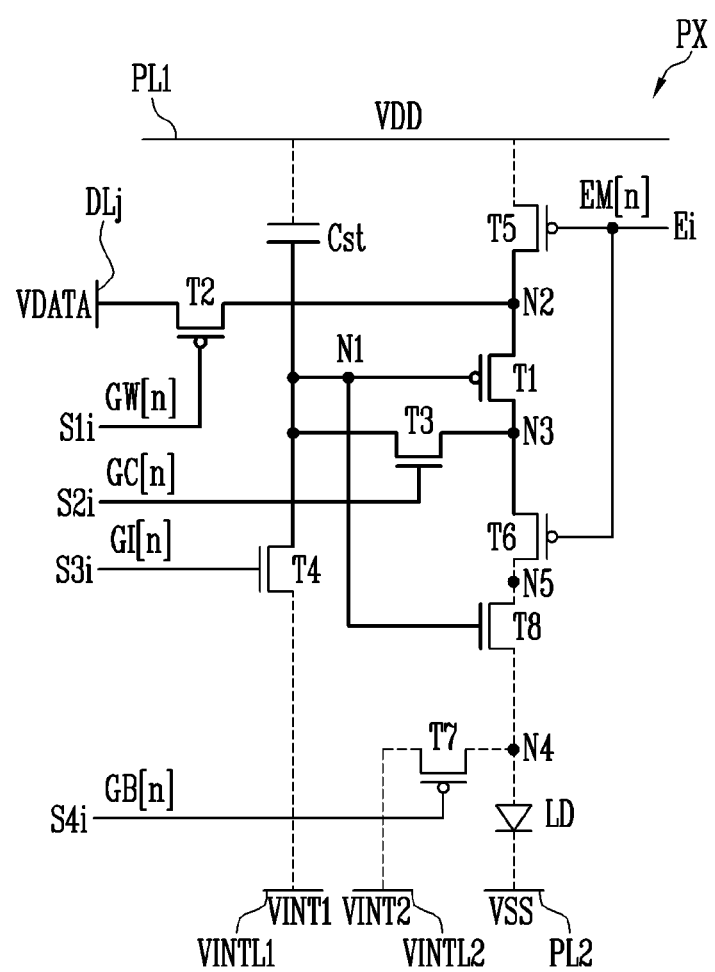
Figure 7:
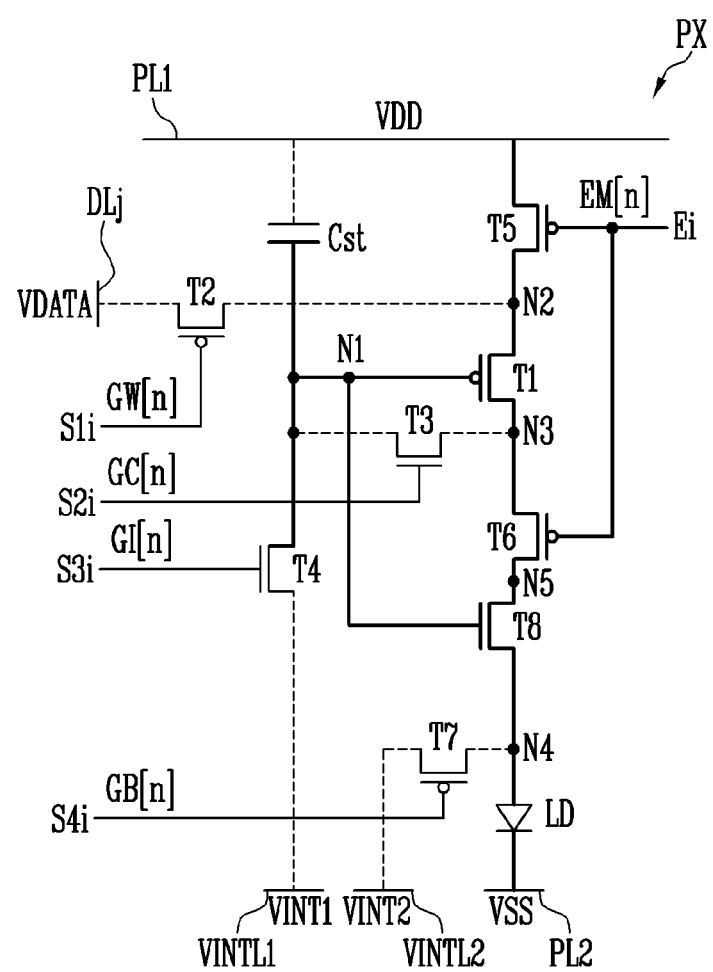
Figure 8:
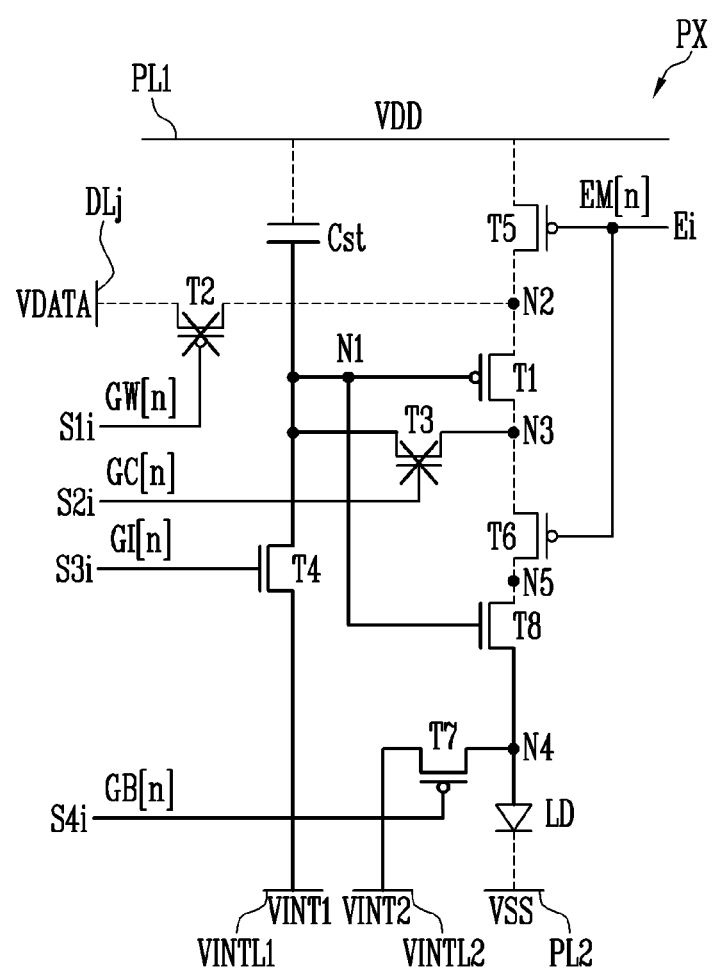
Figure 9:
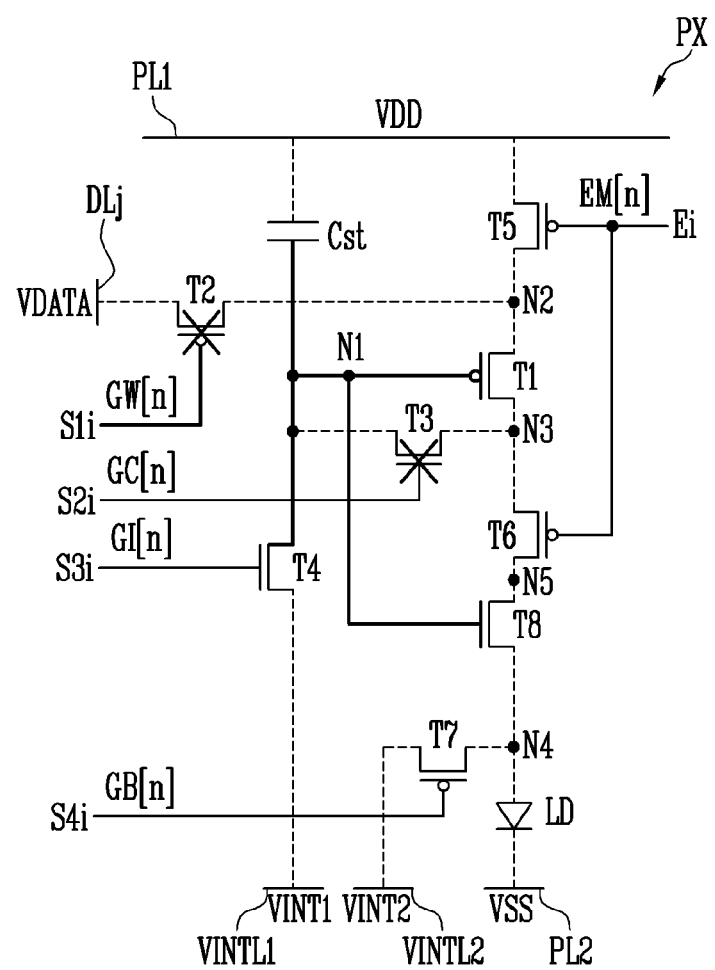
Figure 10:
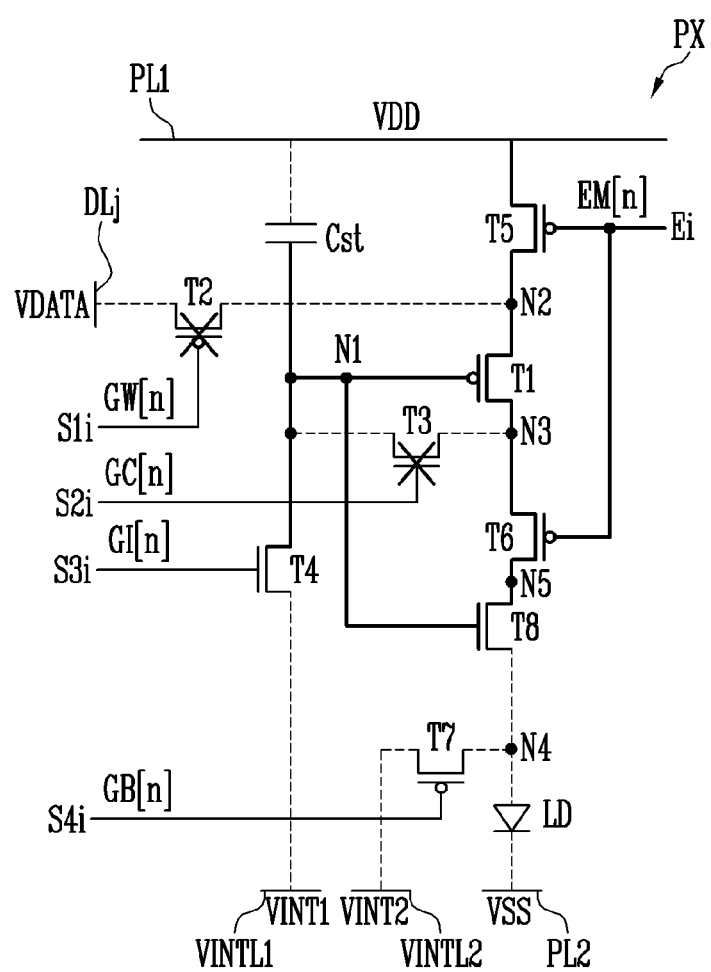

FIGS. 5 to 7 are circuit diagrams for explaining a pixel operation when the pixel of FIG. 3 is normally operated, and FIGS. 8 to 10 are circuit diagrams for explaining a pixel operation when a defect occurs in the pixel of FIG. 3.

Referring to FIGS. 4 to 7, the display device according to an embodiment may include an initialization period P1, a data write period P2, and an emission period P3.

The initialization period P1 may be a period during which a first initialization voltage VINT1 is provided to the first node N1 to initialize the gate electrode of the first transistor T1. The data write period P2 may be a period during which a voltage corresponding to a data voltage VDATA is provided to the first node N1, and the emission period P3 may be a period during which the light-emitting element LD emits light through a driving current.

The operation of the pixel PX performed during the initialization period P1 according to an embodiment is illustrated in FIG. 5, the operation of the pixel PX performed during the data write period P2 is illustrated in FIG. 6, and the operation of the pixel PX performed during the emission period P3 is illustrated in FIG. 7.

At a first time point tt1, an emission control signal EM[n] having a turn-off level (or a logic high level) may be supplied to the emission control line Ei. Here, the fifth transistor T5 and the sixth transistor T6 may be turned off, and a driving current flowing from the first power line PL1 into the second power line PL2 may be blocked.

At a second time point tt2, a fourth scan signal GB[n] having a turn-on level (or a logic low level) may be supplied to the fourth scan line S4i. Accordingly, the seventh transistor T7 may be turned on, a second initialization voltage VINT2 may be applied to the fourth node N4 through the seventh transistor T7, and the voltage of the first electrode (or anode) of the light-emitting element LD may be initialized.

At a third time point tt3, a third scan signal GI[n] having a turn-on level (or a logic high level) may be supplied to the third scan line S3i. Accordingly, the fourth transistor T4 may be turned on, a first initialization voltage VINT1 may be applied to the first node N1 through the fourth transistor T4, and the voltage of the gate electrode of the first transistor T1 may be initialized.

During the initialization period P1 including the second time point tt2 and the third time point tt3, the first initialization voltage VINT1 may be applied to the gate electrode (or the first node N1) of the eighth transistor T8. Here, the first initialization voltage VINT1 may be a value less than the threshold voltage of the eighth transistor T8, and the eighth transistor T8 may remain turned off.

Although the second time point tt2 at which the fourth scan signal GB[n] is applied and the third time point tt3 at which the second scan signal GC[n] is applied are illustrated as being different time points, the present disclosure is not limited thereto. In accordance with another embodiment, the second time point tt2 and the third time point tt3 may be the same time point.

At a fourth time point tt4, the second scan signal GC[n] having a turn-on level (or a logic high level) may be supplied to the second scan line S2i. Accordingly, the third transistor T3 may be turned on, and the first transistor T1 may be connected in the form of a diode.

At a fifth time point tt5, a first scan signal GW[n] having a turn-on level (or a logic low level) may be supplied to the first scan line S1i. Accordingly, the second transistor T2 may be turned on. A data voltage VDATA corresponding to the pixel PX may be applied to the data line Dj. The data voltage VDATA may be applied to the first node N1 (or the gate electrode of the first transistor T1) while sequentially passing through the second transistor T2, the first transistor T1, and the third transistor T3. Here, the voltage applied to the gate electrode of the first transistor T1 may correspond to the difference between the data voltage VDATA and the threshold voltage of the first transistor T1.

The voltage corresponding to the difference between the data voltage VDATA and the threshold voltage of the first transistor T1 may be accumulated in the storage capacitor Cst. Thereafter, even if the first scan signal GW[n] having a turn-off level (or logic high level) is supplied, the first electrode of the first transistor T1 may be maintained at the data voltage VDATA due to parasitic capacitance (not illustrated). Accordingly, the threshold voltage of the first transistor T1 may be compensated for until the second scan signal GC[n] has a turn-off level (or a logic low level). That is, the threshold voltage of the first transistor T1 may be compensated for up to a sixth time point tt6.

The voltage of the first node N1 from the fifth time point tt5 to the sixth time point tt6 may be maintained by the storage capacitor Cst. That is, the voltage of the first node N1 may be the voltage corresponding to the difference between the data voltage VDATA and the threshold voltage of the first transistor T1, and may be a value greater than the threshold voltage of the eighth transistor T8. Accordingly, the eighth transistor T8 may remain turned on. At this time, since the sixth transistor T6 is in a turned-off state, a driving current may not flow into the fourth node N4 through the eighth transistor T8.

At a seventh time point tt7, the fourth scan signal GB[n] having a turn-on level (or a logic low level) may be supplied to the fourth scan line S4i. Accordingly, the seventh transistor T7 may be turned on again. Through the turned-on seventh transistor T7, the second initialization voltage VINT2 may be applied to the first electrode of the light-emitting element LD, and the voltage of the first electrode of the light-emitting element LD may be initialized again. In accordance with an embodiment, the fourth scan signal GB[n] having a turn-on level may be supplied only at any one of the second time point tt2 and the seventh time point tt7.

At an eighth time point tt8, the emission control signal EM[n] having a turn-on level (or a logic low level) may be supplied to the emission control line Ei. In this case, the fifth transistor T5 and the sixth transistor T6 may be turned on.

The gate voltage of the eighth transistor T8 may be maintained by the storage capacitor Cst after the fifth time point tt5. Accordingly, during the emission period P3, the sixth transistor T6 is turned on, so that a driving current may flow from the first power line PL1 into the second power line PL2 through the fifth transistor T5, the first transistor T1, the sixth transistor T6, and the eighth transistor T8. That is, the driving current flows from the first power line PL1 into the second power line PL2, and the light-emitting element LD may emit light with luminance corresponding to the driving current during the emission period P3 after the eighth time point tt8.

Referring to FIGS. 4 and 8 to 10, the display device according to an embodiment may include an initialization period P1, a data write period P2, and an emission period P3.

A defective operation of the pixel PX performed during the initialization period P1 according to an embodiment is illustrated in FIG. 8, a defective operation of the pixel PX performed during the data write period P2 is illustrated in FIG. 9, and the defective operation of the pixel PX performed during the emission period P3 is illustrated in FIG. 10. The defective operation of the pixel PX illustrated in FIGS. 8 to 10 is described below on the assumption that the second transistor T2 and the third transistor T3 are not normally operated.

Referring back to FIG. 1, in the case where the second transistor T2 and the third transistor T3 are not normally operated, the display device according to the embodiment is implemented as a foldable display device including a flexible substrate or the like that is foldable along a folding line FL, thus deteriorating impact resistance performance of the display device. Accordingly, the display device may have a strong possibility of breakdown, and may damage the display panel when it is broken down. When the damage of the display panel locally occurs, there is a high probability that defects will occur in the second transistor T2 and/or the third transistor T3 of the pixel PX.

Referring to FIG. 8, during the initialization period P1, the seventh transistor T7 may be turned on, a second initialization voltage VINT2 may be applied to the fourth node N4 through the seventh transistor T7, and the voltage of the first electrode (or anode) of the light-emitting element LD may be initialized. Further, the fourth transistor T4 may be turned on, a first initialization voltage VINT1 may be applied to the first node N1 through the fourth transistor T4, and the voltage of the gate electrode of the first transistor T1 may be initialized.

That is, even if the second transistor T2 and/or the third transistor T3 are not normally operated during the initialization period P1, the first initialization voltage VINT1 may be applied to the first node N1.

Referring to FIG. 9, the second transistor T2 in which a defect has occurred (i.e., defective second transistor T2) may not be turned on during the data write period P2. Also, the third transistor T3 in which a defect has occurred (i.e., defective third transistor T3) may not be turned on. Accordingly, because a data voltage VDATA is not applied to the first electrode of the first transistor T1, the gate electrode (or the first node N1) of the first transistor T1 may have the first initialization voltage VINT1. The first initialization voltage VINT1 is a value greater than the threshold voltage of the first transistor T1, and thus the first transistor T1 may be turned on.

The eighth transistor T8 may not be turned on due to the first initialization voltage VINT1 stored in the first node N1. That is, the first initialization voltage VINT1 may be lower than the threshold voltage of the eighth transistor T8.

Referring to FIG. 10, the fifth transistor T5 and the sixth transistor T6 may be turned on. However, since the eighth transistor T8 is still turned off, a driving current may not flow from the first power line PL1 into the second power line PL2. Accordingly, the light-emitting element LD may not emit light during the emission period P3. Such a phenomenon may be referred to as a "dark spot defect" in the pixel PX.

Therefore, even if the second transistor T2 and the third transistor T3 are not normally operated, the display device according to an embodiment may effectively prevent the first transistor T1 from supplying an excessive driving current to the light-emitting element LD due to the first initialization voltage VINT1 because the eighth transistor T8 is coupled between the sixth transistor T6 and the light-emitting element LD. That is, a bright spot defect that occurs when the first transistor T1 supplies an excessive driving current to the light-emitting element LD may be effectively minimized due to the eighth transistor T8.

A display device according to a comparative example may not include the eighth transistor T8. That is, in the display device according to the comparative example, the sixth transistor T6 and the first electrode of the light-emitting element LD may be directly coupled to each other.

Accordingly, when defects occur in the second transistor T2 and the third transistor T3, the fifth transistor T5 and the sixth transistor T6 are turned on during the emission period P3, and a driving current may flow from the first power line PL1 to the second power line PL2 through the fifth transistor T5, the first transistor T1, and the sixth transistor T6.

The gate electrode of the first transistor T1 has a voltage corresponding to the first initialization voltage VINT1, and the threshold voltage of the first transistor T1 has a value greater than the first initialization voltage VINT1, and thus the first transistor T1 may be turned on. Since the first electrode of the first transistor T1 has a voltage corresponding to the difference between the first driving voltage VDD and the threshold voltage of the fifth transistor T5, the driving current may have a large value. Accordingly, the light-emitting element LD of the display device according to the comparative example may cause a bright spot defect in which light is emitted with excessive luminance corresponding to the driving current.

In an embodiment, the present disclosure may further include the eighth transistor T8 that is capable of controlling a driving current and that is of a type (i.e., doping type) different from the type of the first transistor T1. Since the sixth transistor T6 is not directly coupled to the first electrode of the light-emitting element LD, this structure effectively minimizes a bright spot defect occurring when the first transistor T1 supplies an excessive driving current to the light-emitting element LD.

Hereinafter, an example of a pixel according to an embodiment will be described in detail with reference to FIG. 11.

Figure 11:
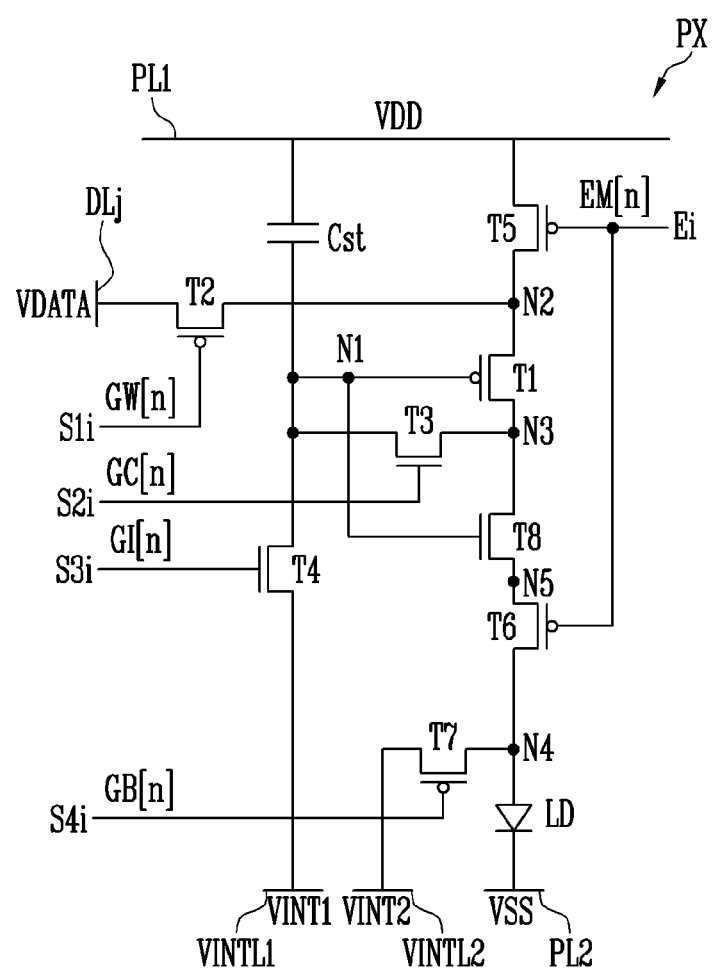
FIG. 11 is a circuit diagram illustrating another example of a pixel according to an embodiment.

FIG. 11 is a circuit diagram illustrating another example of a pixel according to an embodiment. The circuit diagram of FIG. 11 is similar to that described with reference to FIG. 3, and is different therefrom in a connection relationship between a sixth transistor T6 and an eighth transistor T8. Hereinafter, repeated descriptions of embodiments will be omitted, and a description will be made based on differences between the embodiments.

Referring to FIG. 11, the sixth transistor T6 may be coupled between the second electrode (or fifth node N5) of the eighth transistor T8 and the fourth node N4. The gate electrode of the sixth transistor T6 may be coupled to the emission control line Ei.

The eighth transistor T8 may be coupled between the third node N3 and the first electrode (or the fifth node N5) of the sixth transistor T6. The gate electrode of the eighth transistor T8 may be coupled to the first node N1 (i.e., the gate electrode of the first transistor T1).

In an embodiment, the present disclosure may further include the eighth transistor T8 that is capable of controlling a driving current and that is of a type (i.e., doping type) different from the type of the first transistor T1. Since the first transistor T1 is not directly coupled to the first electrode of the light-emitting element LD, this structure effectively minimizes a bright spot defect occurring when the first transistor T1 supplies an excessive driving current to the light-emitting element LD.

Hereinafter, an example of a pixel of a display device according to an embodiment will be described in detail with reference to FIGS. 12 and 13.

Figure 12:
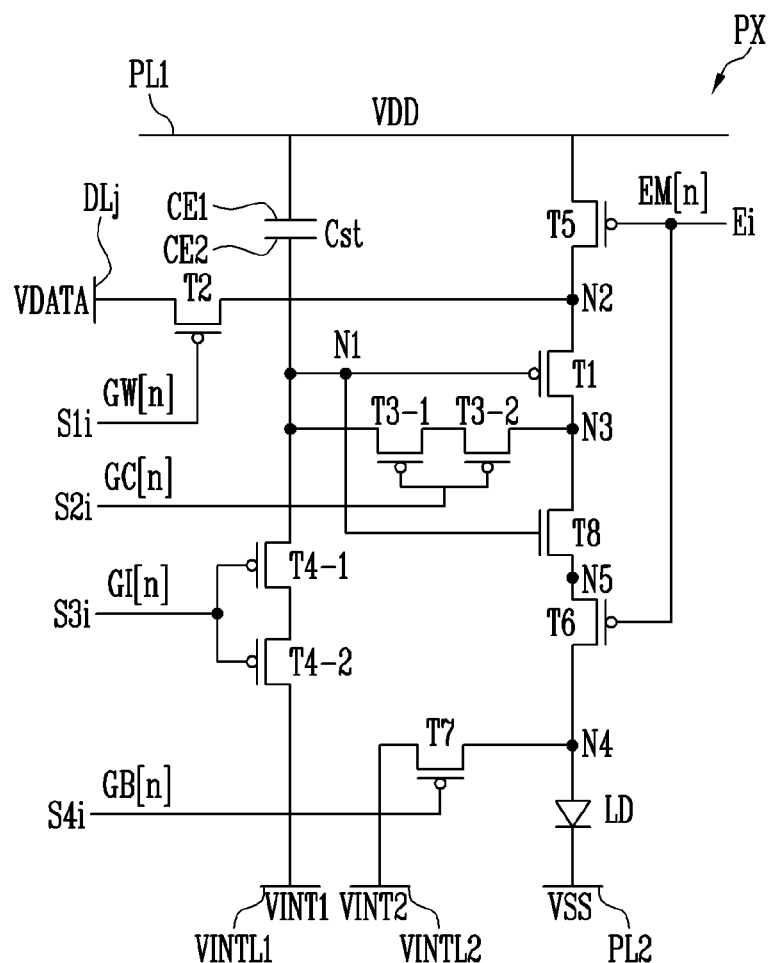
FIG. 12 is a circuit diagram illustrating still another example of a pixel according to an embodiment.
Figure 13:
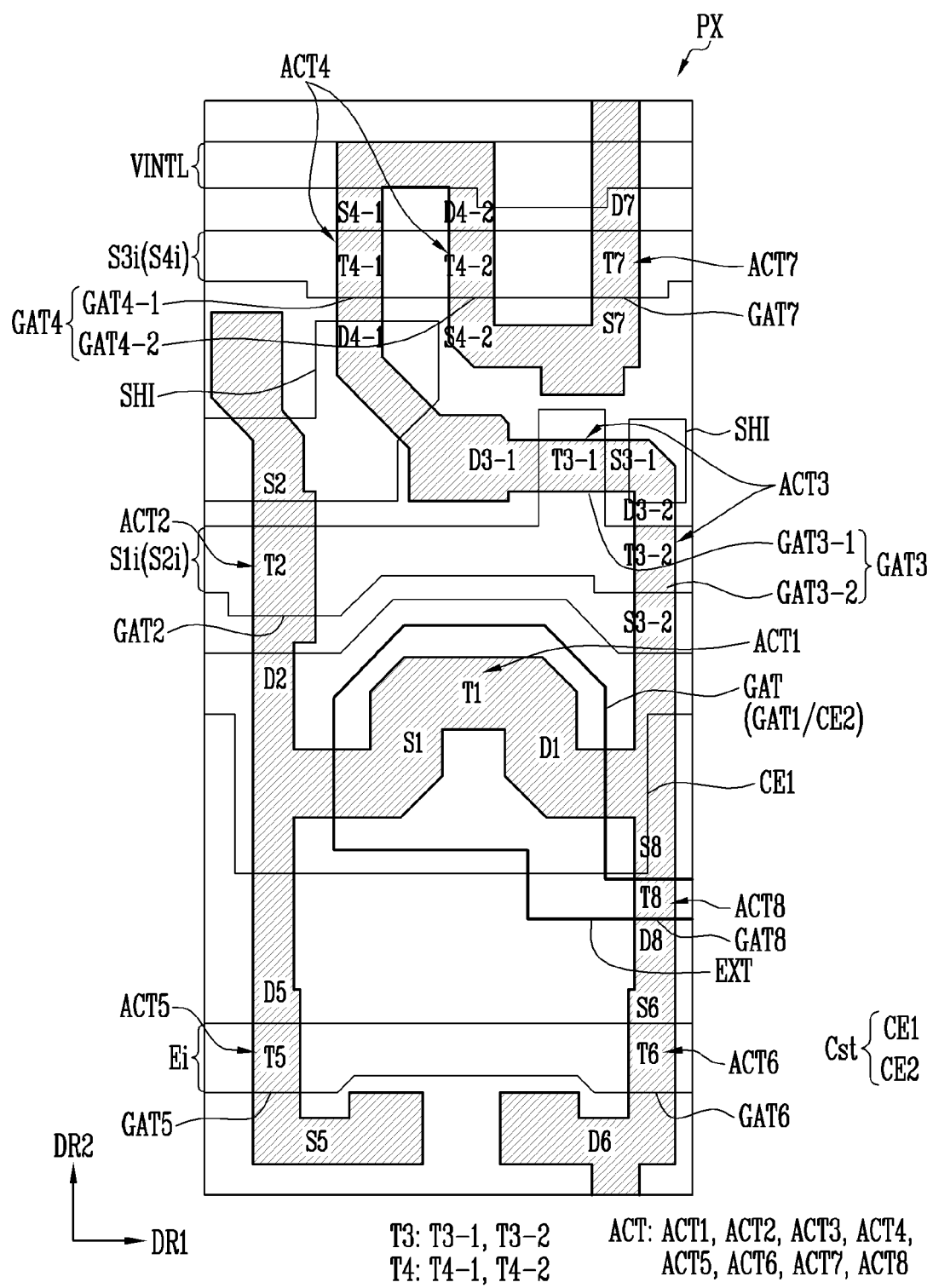
FIG. 13 is a plan view illustrating an example of the pixel of FIG. 12.

FIG. 12 is a circuit diagram illustrating still another example of a pixel according to an embodiment, and FIG. 13 is a plan view illustrating an example of the pixel of FIG. 12.

Referring to FIG. 12, the pixel PX may include a light-emitting element LD, first to eighth transistors T1 to T8, and a storage capacitor Cst.

The circuit diagram of FIG. 12 is similar to the circuit diagram of FIG. 3, and thus repeated descriptions thereof will be omitted and a description will be made based on differences therebetween.

In an embodiment, each of first to eighth transistors T1 to T8 may include a semiconductor layer formed of polycrystalline silicon (polysilicon). A polycrystalline silicon transistor may be a low-temperature polysilicon (LTPS) transistor. The polycrystalline silicon transistor has high electron mobility, and then has driving characteristics faster than those of other transistors.

The first to seventh transistors T1 to T7 may be P-type transistors, and the eighth transistor T8 may be an N-type transistor. That is, in an embodiment, the first transistor T1 and the eighth transistor T8 may be implemented in different types from each other. The present disclosure is not limited thereto, so that the first to seventh transistors T1 to T7 may be N-type transistors, and the eighth transistor T8 may be a P-type transistor in another embodiment.

The third transistor T3 may include a 3-1-th transistor T3-1 and a 3-2-th transistor T3-2. The 3-1-th transistor T3-1 may be coupled to between a first node N1 and a second electrode of the 3-2-th transistor T3-2, and the 3-2-th transistor T3-2 may be coupled between a third node N3 and a first electrode of the 3-1-th transistor T3-1. A gate electrode of the 3-1-th transistor T3-1 and a gate electrode of the 3-2-th transistor T3-2 may be coupled to a second scan line S2i.

The fourth transistor T4 may include a 4-1-th transistor T4-1 and a 4-2-th transistor T4-2. The 4-1-th transistor T4-1 may be coupled between the first node N1 and a second electrode of the 4-2-th transistor T4-2, and the 4-2-th transistor T4-2 may be coupled between a first initialization voltage line VINTL1 and a first electrode of the 4-1-th transistor T4-1. A gate electrode of the 4-1-th transistor T4-1 and a gate electrode of the 4-2-th transistor T4-2 may be coupled to a third scan line S3i.

Referring to FIG. 13, the pixel PX may include a semiconductor layer ACT, a first gate conductive layer, and a second gate conductive layer. In FIG. 13, the plan view of the pixel PX is illustrated based on the active layer ACT and the gate conductive layers. Although not illustrated in the drawing, a data conductive layer including a source electrode and a drain electrode of each transistor may be disposed to overlap the corresponding gate conductive layer in a plan view so that an insulating layer that is capable of covering the gate conductive layer is interposed between the data conductive layer and the gate conductive layer.

The semiconductor layer ACT may be a semiconductor pattern forming channels of the first to eighth transistors T1 to T8. The semiconductor layer ACT may include a source region and a drain region coupled to a source electrode and a drain electrode of each of the first to eighth transistors T1 to T8. In the semiconductor layer ACT, an area between the source region and the drain region may be a channel area.

The semiconductor layer ACT may include a silicon semiconductor (or a polycrystalline silicon semiconductor). The channel area of the semiconductor pattern may be a semiconductor pattern undoped with impurities, and may be an intrinsic semiconductor. Each of the source region and the drain region may be an impurity-doped semiconductor pattern. P-type impurities may be used as the impurities, but the present disclosure is not limited thereto.

The semiconductor layer ACT may include a first semiconductor pattern ACT1, a second semiconductor pattern ACT2, a third semiconductor pattern ACT3, a fourth semiconductor pattern ACT4, a fifth semiconductor pattern ACT5, a sixth semiconductor pattern ACT6, a seventh semiconductor pattern ACT7, and an eighth semiconductor pattern ACT8.

The first to eighth semiconductor patterns ACT1 to ACT8 may be semiconductor patterns extending from each other, and may each overlap first to fourth scan lines S1i to S4i and an emission control line Ei in a plan view.

The first semiconductor pattern ACT1 (or a driving semiconductor pattern) may be the semiconductor layer of the first transistor T1, may extend in a first direction DR1, and may have a bent shape. Due to the bent shape, the channel capacity of the first transistor T1 may be improved. The first semiconductor pattern ACT1 may include a first source region S1 and a first drain region D1 of the first transistor T1.

The second semiconductor pattern ACT2 may be the semiconductor layer of the second transistor T2, and may extend in a second direction DR2. The second semiconductor pattern ACT2 may include a second source region S2 and a second drain region D2 of the second transistor T2. The second source region S2 may be electrically connected to a data line Dj (see FIG. 12) through a contact hole in an insulating layer. Accordingly, a data voltage VDATA (see FIG. 12) may be applied to a gate electrode of the first transistor T1 through the second transistor T2.

The third semiconductor pattern ACT3 may be a semiconductor layer of the third transistor T3, and may have a shape bent in the first direction DR1 and the second direction DR2. A portion of the bent shape may be the semiconductor layer of the 3-1-th transistor T3-1, and the other portion of the bent shape may be the semiconductor layer of the 3-2-th transistor T3-2. The third semiconductor pattern ACT3 may extend from the fourth semiconductor pattern ACT4 in the first direction DR1. The third semiconductor pattern ACT3 may include a 3-1-th source region S3-1 and a 3-1-th drain region D3-1 of the 3-1-th transistor T3-1, and a 3-2-th source region S3-2 and a 3-2-th drain region D3-2 of the 3-2-th transistor T3-2.

The fourth semiconductor pattern ACT4 may be the semiconductor layer of the fourth transistor T4, and may have a bent shape partially extending in the second direction DR2. A portion of the bent shape may be the semiconductor layer of the 4-1-th transistor T4-1, and the other portion of the bent shape may be the semiconductor layer of the 4-2-th transistor T4-2. The fourth semiconductor pattern ACT4 may include a 4-1-th source region S4-1 and a 4-1-th drain region D4-1 of the 4-1-th transistor T4-1, and a 4-2-th source region S4-2 and a 4-2-th drain region D4-2 of the 4-2-th transistor T4-2. The 4-2-th source region S4-2 may be electrically connected to the first initialization voltage line VINTL1 through a contact hole in an insulating layer, a bridge electrode, etc. Accordingly, the first initialization voltage VINT1 (see FIG. 12) may be applied through the fourth transistor T4.

The fifth semiconductor pattern ACT5 may be the semiconductor layer of the fifth transistor T5, and may extend in the second direction DR2. The fifth semiconductor pattern ACT5 may extend from the second semiconductor pattern ACT2 in the second direction DR2. The fifth semiconductor pattern ACT5 may include a fifth source region S5 and a fifth drain region D5 of the fifth transistor T5. The fifth source region S5 may be electrically connected to a first power line PL1 (see FIG. 12) through a contact hole in an insulating layer. Accordingly, a first driving voltage VDD (see FIG. 12) may be applied through the fifth transistor T5.

The sixth semiconductor pattern ACT6 may be the semiconductor layer of the sixth transistor T6, and may extend in the second direction DR2. The sixth semiconductor pattern ACT6 may include a sixth source region S6 and a sixth drain region D6 of the sixth transistor T6. The sixth drain region D6 may be electrically connected to a first electrode of a light-emitting element LD (see FIG. 12) through a contact hole in an insulating layer.

The seventh semiconductor pattern ACT7 may be the semiconductor layer of the seventh transistor T7, and may extend in the second direction DR2. The seventh semiconductor pattern ACT7 may extend in the second direction DR2 from the sixth semiconductor pattern ACT6 of a previous pixel disposed on a row previous to that of the corresponding pixel. The seventh semiconductor pattern ACT7 may include a seventh source region S7 and a seventh drain region D7 of the seventh transistor T7. The seventh source region S7 may be electrically connected to a second initialization voltage line VINTL2 through a contact hole in an insulating layer, a bridge electrode, etc. Accordingly, a second initialization voltage VINT2 may be applied through the seventh transistor T7.

The eighth semiconductor pattern ACT8 (or an emission control semiconductor pattern) may be the semiconductor layer of the eighth transistor T8, and may extend in the second direction DR2. The eighth semiconductor pattern ACT8 may extend from the third semiconductor pattern ACT3 and the sixth semiconductor pattern ACT6 in the second direction DR2. The eighth semiconductor pattern ACT8 may include an eighth source region S8 and an eighth drain region D8 of the eighth transistor T8.

The first gate conductive layer may include the first scan line S1i, the third scan line S3i, the emission control line Ei, and a gate electrode GAT.

The first scan line S1i may extend in the first direction DR1, and may have a portion partially extending in the second direction DR2. A first scan signal GW[n] (see FIG. 12) may be applied to the first scan line S1i, and a second scan signal GC[n] (see FIG. 12) may be applied thereto at timing different from the timing of the first scan signal. The first scan line S1i may be a component substantially the same as the first scan line S1i and the second scan line S2i, described above with reference to FIG. 12. That is, the first scan line S1i and the second scan line S2i may be implemented in the same gate conductor.

The first scan line S1i may overlap the second semiconductor pattern ACT2 to form the second gate electrode GAT2 of the second transistor T2, and may overlap the third semiconductor pattern ACT3 to form the 3-1-th gate electrode GAT3-1 of the 3-1-th transistor T3-1 and to form the 3-2-th gate electrode GAT3-2 of the 3-2-th transistor T3-2 in a plan view.

The third scan line S3i may extend in the first direction DR1. A third scan signal GI[n] (see FIG. 12) may be applied to the third scan line S3i, and a fourth scan signal GB[n] (see FIG. 12) may be applied to thereto at timing different from the timing of the third scan signal. The third scan line S3i may be a component substantially the same as the third scan line S3i and the fourth scan line S4i, described above with reference to FIG. 12. That is, the third scan line S3i and the fourth scan line S4i may be implemented in the same gate conductor.

The third scan line S3i may overlap the fourth semiconductor pattern ACT4 to form the 4-1-th gate electrode GAT4-1 of the 4-1-th transistor T4-1 and to form the 4-2-th gate electrode GAT4-2 of the 4-2-th transistor T4-2 in a plan view. Also, the third scan line S3i may overlap the seventh semiconductor pattern ACT7 to form the seventh gate electrode GAT7 of the seventh transistor T7.

The emission control line Ei may extend in the first direction DR1. An emission control signal EM[n] may be applied to the emission control line Ei. The emission control line Ei may be a component substantially the same as the emission control line Ei, described above with reference to FIG. 12.

The emission control line Ei may overlap the fifth semiconductor pattern ACT5 to form the fifth gate electrode GAT5 of the fifth transistor T5, and may overlap the sixth semiconductor pattern ACT6 to form the sixth gate electrode GAT6 of the sixth transistor T6 in a plan view.

The gate electrode GAT may have a specific area, and may be disposed between the first scan line S1i and the emission control line Ei along the second direction DR2. The gate electrode GAT may overlap the first semiconductor pattern ACT1 in a plan view, and may be the first gate electrode GAT1 of the first transistor T1.

The gate electrode GAT may extend in the second direction DR2, and may include an extension portion EXT that partially extends in the first direction DR1. The extension portion EXT may overlap the eighth semiconductor pattern ACT8 in a plan view to constitute the eighth gate electrode GAT8 of the eighth transistor T8. That is, one gate electrode GAT may include the gate electrode of the first transistor T1 and the gate electrode of the eighth transistor T8. Accordingly, the eighth transistor T8 may be implemented even if a pixel area is not greatly widened. The gate electrode GAT may be substantially the same as the gate electrode of the first transistor T1 and the gate electrode of the eighth transistor T8, which are coupled to the first node N1, described above with reference to FIG. 12.

The gate electrode GAT may overlap a storage first electrode CE1, which will be described later, and the gate electrode GAT and the storage first electrode CE1 may form the storage capacitor Cst with an insulating layer interposed therebetween in a portion overlapping the storage first electrode CE1. Here, the gate electrode GAT may be referred to as a "storage second electrode CE2".

The second gate conductive layer may include the storage first electrode CE1, an initialization voltage line VINTL, and a shield electrode SHI.

The storage first electrode CE1 may extend in the first direction DR1, and may overlap the gate electrode GAT and the first semiconductor pattern ACT1 in a plan view. As described above, the storage first electrode CE1 may form a storage capacitor Cst together with the storage second electrode CE2. The storage capacitor Cst may be substantially the same as the storage capacitor Cst, described above with reference to FIG. 12.

The initialization voltage line VINTL may extend in the first direction DR1. The initialization voltage line VINTL may at least partially overlap the fourth semiconductor pattern ACT4 and the seventh semiconductor pattern ACT7 in a plan view. The first initialization voltage VINT1 (see FIG. 12) or the second initialization voltage VINT2 (see FIG. 12) may be applied to the initialization voltage line VINTL.

The shield electrode SHI may have an island shape, and may be disposed to at least partially overlap the semiconductor layer ACT in a plan view. For example, the shield electrode SHI may at least partially overlap the third semiconductor pattern ACT3, and may at least partially overlap the fourth semiconductor pattern ACT4 and the second semiconductor pattern ACT2. The shield electrode SHI may function to block light that may flow into the pixel PX.

While various exemplary embodiments have been described above, those skilled in the art will appreciate that various modifications, additions and substitutions are possible, without departing from the scope and spirit of the disclosure.

Therefore, the embodiments disclosed in this specification are only for illustrative purposes rather than limiting the technical spirit of the present disclosure. The scope of the present disclosure must be defined by the accompanying claims.

A pixel and a display device having the pixel according to embodiments may further include an additional emission control transistor that is of a type (i.e., doping type) different from the type of a driving transistor and that is capable of controlling a driving current between an existing emission control transistor and a light-emitting element, thus effectively minimizing a bright spot defect occurring when the driving transistor supplies an excessive driving current to the light-emitting element.

Effects according to the embodiments are not limited by the above-mentioned effect, and various effects are included in the present specification.

What is claimed is:

1. A pixel, comprising:
a driving transistor including a gate electrode coupled to a first node, a first electrode coupled to a second node, and a second electrode coupled to a third node;
a first initialization transistor coupled between the first node and a first initialization voltage line, and including a gate electrode coupled to a scan line, wherein the first initialization voltage line is configured to supply a first initialization voltage;
a first emission control transistor coupled between a fourth node and a fifth node, and including a gate electrode coupled to the first node;
a second emission control transistor coupled between the third node and the fifth node, and including a gate electrode coupled to an emission control line; and
a light-emitting element coupled between the fourth node and a driving low voltage line,
wherein the driving transistor and the first emission control transistor are different types of transistors from each other.

2. The pixel according to claim 1, wherein a first electrode of the first emission control transistor and a first electrode of the second emission control transistor are coupled to the fifth node.

3. The pixel according to claim 1, further comprising:
a switching transistor coupled between a data line and the second node, and including a gate electrode coupled to a first scan line, wherein the switching transistor is configured to supply a data voltage; and
a compensation transistor coupled between the first node and the third node, and including a gate electrode coupled to a second scan line,
wherein the scan line coupled to the gate electrode of the first initialization transistor is a third scan line.

4. The pixel according to claim 3, wherein each of the compensation transistor and the first initialization transistor includes an oxide semiconductor layer.

5. The pixel according to claim 3, further comprising:
a third emission control transistor coupled between a driving high voltage line and the second node, and including a gate electrode coupled to the emission control line; and
a second initialization transistor coupled between a second initialization voltage line and the fourth node, and including a gate electrode coupled to a fourth scan line, wherein the second initialization voltage line is configured to supply a second initialization voltage.

6. The pixel according to claim 5, wherein each of the driving transistor, the switching transistor, the first emission control transistor, the second emission control transistor, the third emission control transistor, and the second initialization transistor includes a polycrystalline silicon semiconductor layer.

7. The pixel according to claim 5, wherein, when a fourth scan signal is supplied to the fourth scan line, the second initialization transistor is turned on, the second initialization voltage is applied to the fourth node, and a voltage of a first electrode of the light-emitting element is initialized.

8. The pixel according to claim 7, wherein, when a third scan signal is supplied to the third scan line, the first initialization transistor is turned on, the first initialization voltage is applied to the first node, and a voltage of the gate electrode of the driving transistor is initialized.

9. The pixel according to claim 8, wherein, when a first scan signal is supplied to the first scan line, the switching transistor is turned on, whereas when a second scan signal is supplied to the second scan line, the compensation transistor is turned on, and a voltage corresponding to a difference between the data voltage and a threshold voltage of the driving transistor is applied to the first node.

10. The pixel according to claim 9, wherein a threshold voltage of the first emission control transistor is less than the voltage of the first node and is greater than the first initialization voltage.

11. The pixel according to claim 10, wherein, when the second emission control transistor and the third emission control transistor are turned on, a driving current that is provided through the driving transistor is not supplied to the light-emitting element.

12. A pixel, comprising:
a first transistor including a gate electrode coupled to a first node, a first electrode coupled to a second node, and a second electrode coupled to a third node;
a second transistor coupled between a data line and the second node, and including a gate electrode coupled to a first scan line, wherein the data line is configured to supply a data voltage;
a third transistor coupled between the first node and the third node, and including a gate electrode coupled to a second scan line,
a fourth transistor coupled between the first node and a first initialization voltage line, and including a gate electrode coupled to a third scan line, wherein the first initialization voltage line is configured to supply a first initialization voltage;
a fifth transistor coupled between a driving high voltage line and the second node, and including a gate electrode coupled to an emission control line;
a sixth transistor coupled between a fourth node and a fifth node and including a gate electrode coupled to the emission control line;
a seventh transistor coupled between a second initialization voltage line and the fourth node, and including a gate electrode coupled to a fourth scan line, wherein the second initialization voltage line is configured to supply a second initialization voltage;
an eighth transistor coupled between the third node and the fifth node and including a gate electrode coupled to the first node; and
a light-emitting element coupled between the fourth node and a driving low voltage line,
wherein the fifth node couples a first electrode of the sixth transistor to a first electrode of the eighth transistor, and
wherein the first transistor and the eighth transistor are different types of transistors from each other.

13. The pixel according to claim 12, wherein each of the third transistor and the fourth transistor includes an oxide semiconductor layer.

14. The pixel according to claim 13, wherein each of the first transistor, the second transistor, the fifth transistor, the sixth transistor, the seventh transistor, and the eighth transistor includes a polycrystalline silicon semiconductor layer.

15. The pixel according to claim 12, wherein, when a fourth scan signal is supplied to the fourth scan line, the seventh transistor is turned on, the second initialization voltage is applied to the fourth node, and a voltage of a first electrode of the light-emitting element is initialized.

16. The pixel according to claim 15, wherein, when a third scan signal is supplied to the third scan line, the fourth transistor is turned on, the first initialization voltage is applied to the first node, and a voltage of the gate electrode of the first transistor is initialized.

17. The pixel according to claim 16, wherein:
when a first scan signal is supplied to the first scan line, the second transistor is turned on, whereas when a second scan signal is supplied to the second scan line, the third transistor is turned on, and a voltage corresponding to a difference between the data voltage and a threshold voltage of the first transistor is applied to the first node, and
the voltage of the first node is greater than a threshold voltage of the eighth transistor.

18. A display device, comprising:
a substrate;
a semiconductor layer disposed on the substrate, and including a driving semiconductor pattern and an emission control semiconductor pattern; and
a first gate conductive layer which at least partially overlaps the semiconductor layer in a plan view, and including a gate electrode,
wherein a first portion of the gate electrode overlapping the driving semiconductor pattern constitutes a gate electrode of a driving transistor, and an extension portion of the gate electrode overlapping the emission control semiconductor pattern constitutes a gate electrode of an emission control transistor.

19. The display device according to claim 18, further comprising:
a second gate conductive layer including a storage first electrode overlapping the gate electrode in the plan view,
to wherein the gate electrode of the driving transistor overlaps the storage first electrode to form a storage capacitor.

20. The display device according to claim 18, wherein the semiconductor layer includes a polycrystalline silicon semiconductor.

* * * * *